United States Patent [19]
Van Doorn

[11] Patent Number: 4,808,810
[45] Date of Patent: Feb. 28, 1989

[54] PREAMPLIFIER FOR AN OPTICAL RECEIVER

[75] Inventor: Willem Van Doorn, Hilversum, Netherlands

[73] Assignee: AT&T and Philips Telecommunications B.V., Hilversum, Netherlands

[21] Appl. No.: 99,943

[22] Filed: Sep. 23, 1987

[30] Foreign Application Priority Data

Sep. 24, 1986 [NL] Netherlands .................. 8602408

[51] Int. Cl.⁴ .............................. H01J 40/14
[52] U.S. Cl. .................. 250/214 A; 250/214 AG
[58] Field of Search ....... 250/214 A, 214 R, 214 AG, 250/214 C; 330/54, 308; 455/619, 617, 606, 607

[56] References Cited

U.S. PATENT DOCUMENTS

| | | | |
|---|---|---|---|
| 3,911,268 | 10/1975 | Mori et al. | 307/311 |
| 4,415,803 | 11/1983 | Muoi | 250/214 A |
| 4,498,001 | 2/1985 | Smoot | 330/308 |
| 4,647,762 | 3/1987 | Chown | 250/214 A |
| 4,723,313 | 2/1988 | Folcke et al. | 455/619 |

*Primary Examiner*—David C. Nelms
*Attorney, Agent, or Firm*—Lucian C. Canepa

[57] ABSTRACT

An optical high-impedance preamplifier for processing signals over a large dynamic and automatically operating control range. The automatic control is provided by a variable impedance which is arranged in series with the source circuit of a current-stabilized input MOSFET of the optical preamplifier. As a result thereof, no overloading or loss of sensitivity occurs at a high or low input level.

3 Claims, 1 Drawing Sheet

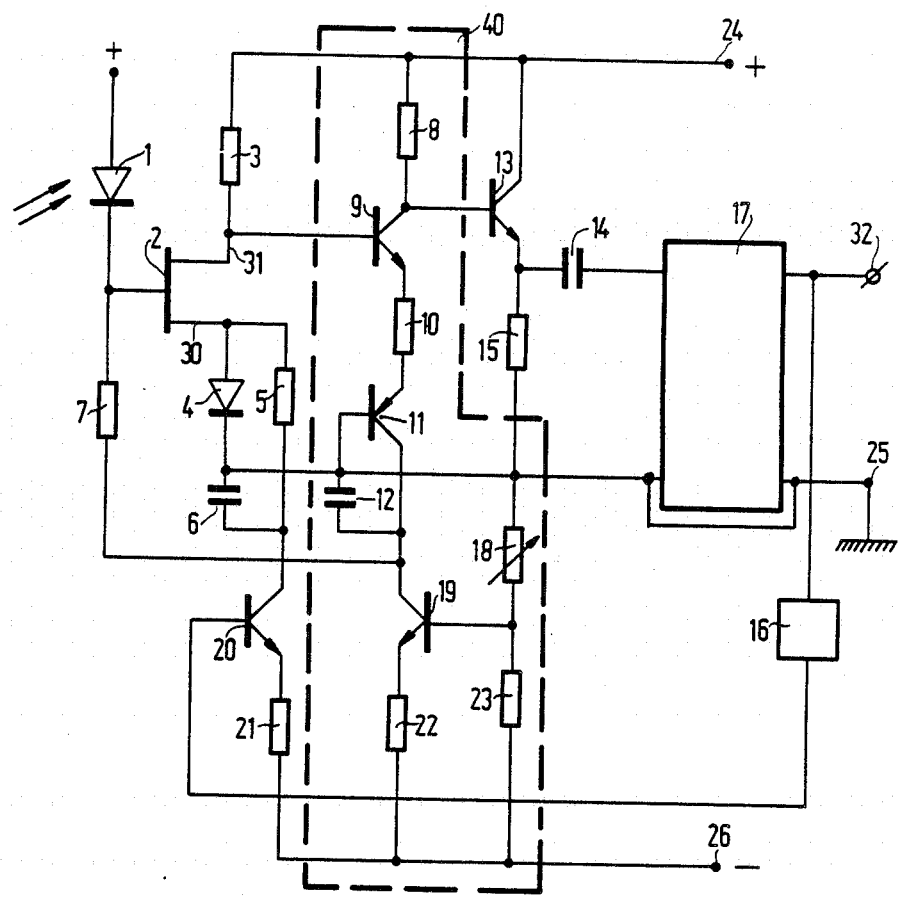

PREAMPLIFIER FOR AN OPTICAL RECEIVER

The invention relates to an optical high-impedance preamplifier for processing signals over a wide dynamic and automatically operating control range, followed by a differential amplifier with output amplifier, including a photo diode and a field effect transistor, the photo diode being connected to the gate electrode of the field effect transistor, the preamplifier including a current stabilization circuit for setting the current through the main current path of the field effect transistor to a substantially constant value. Optical receivers are used in optical transmission systems. The maximum length of an optical link between an optical transmitter and an optical receiver is not only determined by the transmit level of the optical transmitter, the cable attenuation and the input sensitivity of the optical receiver, but to a significant extent also by the attenuation produced by the number of anticipated repair splices/km during the operating life of the optical transmission system.

Assuming there are three repair splices per km, each producing an attenuation of 0.15 dB, and a maximum cable length of 25 kms, then an additional amount of optical attenuation of $25 \times 0.45 = 11.25$ dB must be taken into account. This implies that when a cable of this length is used the input level of the optical receiver must exceed its maximum sensitivity by 11.25 dB. For shorter cable lengths it will then already soon be necessary to use optical attentuation means to prevent the optical receiver from being overdriven.

U.S. Pat. No. 4,415,803 discloses an optical receiver in which measures have been taken to increase the dynamic range of the optical receiver. Here dynamic range must be understood to mean the permissible optical power between a minimum and a maximum level without overdriving of the optical receiver occurring. As a measure of increasing the dynamic control range, a variable impedance is provided in parallel with the input of the optical receiver. The value of the variable impedance is varied with the aid of a control signal derived from the optical receiver output signal. By means of the variable impedance the output voltage of the optical receiver is kept at a prescribed value through the overall modulation width.

This measure has the disadvantage that when it is applied to an optical receiver having a field effect transistor for its input stage, this produces a signficant decrease in the input sensitivity of the optical receiver and consequently also in the maximum permissible cable length of the optical transmission system.

The present invention has for its object to provide a solution for this problem, and is characterized, in that the source electrode of the field effect transistor includes a variable impedance coupled to a controllable current source having a control input, the output of the output amplifier being connected to the control input of the variable current source via a peak detector.

The sole FIGURE is a circuit representation of the invention.

The invention and its advantages will now be described, by way of example, with reference to the accompanying drawing.

In the embodiment of the optical preamplifier shown in the sole FIGURE, the photo diode 1 is connected to the gate electrode of the field effect transistor 2. The drain electrode 31 of the field effect transistor 2 is connected via a resistor 3 to a point 24 of constant potential and also to the base electrode of the transistor 9. The collector of the transistor 9 is connected via a resistor 8 to a point 24 of constant potential and also to the transistor 13. The collector of the transistor 13 is connected to a constant-potential point 24. The emitter of the transistor 13 is connected via the resistor 15 to a point 25 of constant potential and via the differentiating capacitance 14 to the input of the differential amplifier with optical output amplifier 17. The emitter of the transistor 9 is connected to the emitter of the transistor 11 via the resistor 10. The base of the transistor 11 is connected to a point 25 of constant potential. The collectors of the transistors 19 and 11 are isolated from earth via the capacitance 12 and are also connected to the gate electrode of the field effect transistor 2. The emitter of the transistor 19 is connected via a resistor 22 to a point 26 of constant potential and via the resistor 18 to a point 25 of constant potential. The source electrode 30 of the field effect transistor 2 is connected via a diode 4 to a constant-potential point 25 and via a resistor 5 to the collector of the transistor 20. The collector of the transistor 20 is connected via a capacitance 6 to a constant-potential point 25. The emitter of the transistor 20 is connected via a resistor 21 to a constant-potential point 26. The base of the transistor 20 is connected to the output 32 of the optical amplifier via a peak detector 16.

The transistors 9, 11 and 19 together with the resistors 8, 10, 18, 22 and 23 constitute a current stabilization circuit 40. The transistor 19 together with the resistor 22 constitutes a direct current source which is settable to a desired current value with the aid of the resistors 18 and 23. The transistors 11 and 9 arranged in series with this direct current source are constrained to carry the same direct current. As a result thereof, the base voltage of the transistor 9 is determined and is equal to the sum of the base-emitter voltages of the transistors 9 and 11 and the voltage drop across the resistor 10. As a result thereof, the d.c. voltage across the resistor 3 is also constant. Since this d.c. voltage is generated by the direct current flowing through the main current path of the field effect transistor 2, this implies that the direct current flowing through the main current path of the field effect transistor 2 is also constant.

The gate electrode of the field effect transistor 2 is connected to the collectors of the transistors 11 and 19 via the resistor 7 and, consequently, has no fixed potential. In this circuit, which is negatively fed back for direct current, the gate-source voltage of the field effect transistor 2 has the possibility to adjust itself to the required value at a given circuit current. The current flowing through the photodiode 1 produces a voltage drop across the resistor 7. This voltage drop does not affect the setting of the field effect transistor 2, provided the operating range between the transistor 19 and ground is sufficiently large.

A variable impedance, formed by the PIN-diode 4 and a resistor 5 arranged in parallel therewith and being isolated from ground via a capacitor 6, is provided in the source circuit of the field effect transistor 2. The variable impedance is current-controlled by the transistor 20. With the aid of the peak detector 16, a control voltage which is applied to the base electrode of the transistor 20 is derived from the voltage occurring at the output 32. When the input level is low, this control voltage is such that the transistor 20 does not consume current. The resistor 5 then carries no current. In this case the total current flowing through the main current path of the field effect transistor 2 passes through the PIN-diode 4, which has such a low impedance, for example, 7.5 ohm, that the input sensitivity of the optical amplifier is hardly influenced. In this case the voltage drop across the PIN-diode 4 amounts to approximately 0.7 volt. This has no influence whatsoever on the setting of the field effect transistor 2, since this current is a stabilized current and is negatively fedback for direct current, as is described in the foregoing.

With the aid of the control voltage produced at the base of transistor 20, this transistor 20 is rendered conductive versus an increasing input level. In response thereto, current is withdrawn from the PIN-diode 4 via the resistor 5, causing the impedance to increase. The variable impedance functions as a local, negative feedback in the source circuit of the field effect transistor 2, which causes the gain in the preamplifier stage to decrease and the point at which the amplifier is overdriven to get higher. The end of the control is reached when the PIN-diode 4 has become currentless. In that case the current flowing through the main current path of the field effect transistor flows wholly through the resistor 5.

The value R of the resistor 5 determines, together with the slope of the field effect transistor 2, the desired control range $\Delta/\mu$ and the preamplifier overdrive wheel and can be found using the following relation:

$$\Delta\mu = 20 \log \left| \frac{1/S + R}{1/S + R(p)} \right|.$$

Herein: S=slope of the field effect transistor.

R(p)=minimum resistance of PIN-diode.

Customary values are: S=30 ma/V

R(p)=7.5 ohm for 12 mA.

If a control range $\Delta/\mu$ of, for example, 15 dB is wanted, then R becomes:

$R = 10^{0.75} \cdot (33.3 + 7.5) - 33.3 = 196$ ohm.

The frequency band to be transmitted and the accuracy it requires ultimately determine the maximum permissible value of R and the control range and overdrive level thereof, because of the fact that the capacitance of the PIN-diode 4 and the capacitance of the source of the field effect transistor 2 are connected to ground in parallel with resistor 5. This parasitic capacitance will easily reach a total value of 0.3 pF, being a capacitance impedance of 530 ohm at 1 GHz. At this high frequency a level variation of 15 dB is indeed possible, if a small inductance is included in series with the resistor 5 to compensate for said capacitance.

What is claimed is:

1. An optical high-impedance amplifier circuit for processing signals over a wide dynamic and automatically operating control range comprising a photodiode, a field-effect transistor, a preamplifier including output terminals and a differential amplifier including an output amplifier, said photodiode being connected to the gate electrode of said field-effect transistor, said preamplifier including a current source and a variable impedance,
   (1) said variable impedance connected to the source electrode of said field-effect transistor and coupled to said controllable current source,
   (2) said controllable current source having a control input, an output of said output amplifier being connected to said control input via a peak detector,
   (3) and said current stabilization circuit connected to said field-effect transistor to set the current through the main current path of said field-effect transistor to a substantially constant value, said differential amplifier connected to the output terminals of said preamplifier.

2. An optical amplifier circuit as claimed in claim 1, characterized in that the source electrode (30) of the field-effect transistor (2) is connected to the output of the controllable current source (20) via a resistor (5) and also to a point of constant potential (25) via a diode (4), the output of the controllable current source (20) being connected via an isolating capacitor (6) to a point (25) of constant potential.

3. An optical amplifier circuit as claimed in claim 2, characterized in that an inductance is arranged in series with the resistor (5).

* * * * *